(12) United States Patent
Unno (10) Patent No.: US 7,345,260 B2
(45) Date of Patent: Mar. 18, 2008

(54) HEATER AND METHOD OF MANUFACTURING THE SAME

(75) Inventor: Yutaka Unno, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/484,284

(22) Filed: Jul. 11, 2006

(65) Prior Publication Data

US 2006/0289449 A1    Dec. 28, 2006

Related U.S. Application Data

(62) Division of application No. 10/639,765, filed on Aug. 12, 2003, now abandoned.

(30) Foreign Application Priority Data

Aug. 21, 2002   (JP)   ............................. 2002-241119

(51) Int. Cl.
    *B23K 10/00*   (2006.01)
(52) U.S. Cl. ...................... 219/497; 219/544; 219/548; 219/121.43; 219/443.1; 338/304; 118/725
(58) Field of Classification Search ................ 219/494, 219/497, 443.1, 444.1, 543, 544, 546, 548, 219/121.43; 338/300, 283, 304, 306; 118/723, 118/724, 725
See application file for complete search history.

(56) References Cited

U.S. PATENT DOCUMENTS

| 5,997,998 | A | 12/1999 | Sawamura |
| 6,080,970 | A | 6/2000 | Yoshida et al. |
| 6,133,557 | A | 10/2000 | Kawanabe et al. |
| 6,548,787 | B2 | 4/2003 | Natsuhara et al. |
| 6,653,603 | B2 | 11/2003 | Yamaguchi |
| 2002/0102512 | A1 | 8/2002 | Yamaguchi |
| 2004/0011780 | A1* | 1/2004 | Sun et al. ................ 219/444.1 |

FOREIGN PATENT DOCUMENTS

| JP | 59-146036 | 4/1986 |
| JP | 04-087180 | 3/1992 |
| JP | 11-162620 | 6/1999 |
| JP | 2002-124367 | 4/2002 |

* cited by examiner

*Primary Examiner*—Mark Paschall
(74) *Attorney, Agent, or Firm*—Burr & Brown

(57) ABSTRACT

A heater including a plate-shaped substrate having a heating surface for heating an object and a heater element provided in the substrate or on its surface. A central axis C2 of a circumscribed circle of the heater element and a central axis C1 of the substrate are not on the same axis and a gap exists between the axes. When manufacturing the heater, a central axis C1 of a resistant heater is specified, thermal uniformity of the heating surface of a preliminary substrate is evaluated, and a central axis C2 of the substrate is specified. The central axis C2 is specified at a position where the thermal uniformity of the heating surface is superior to a case where the central axis C2 of the substrate is located on the central axis C1. Then a substrate having the central axis C2 is formed by subjecting the preliminary substrate to grinding processing.

8 Claims, 9 Drawing Sheets

HEATER AND METHOD OF MANUFACTURING THE SAME

CROSS REFERENCE TO RELATED APPLICATIONS

This application is a division of U.S. application Ser. No. 10/639,765, filed Aug. 12, 2003 now abandoned and claims the benefit under 35 USC § 119(a)-(d) of Japanese Patent Application No. 2002-241119, filed on Aug. 21, 2002, the entireties of which are incorporated herein by reference.

BACKGROUND OF THE INVENTION

1. Field of the Invention

The present invention relates to a heater used for heating a substrate, such as a semiconductor wafer and a liquid crystal substrate, and a method of manufacturing the same.

2. Description of the Related Art

In general, a heater which heats a semiconductor wafer and the like at least includes a substrate having a heating surface on which an object to be heated, such as a wafer, is placed and a resistant heater element embedded in this substrate.

This heater is manufactured by discriminating a peripheral shape of the resistant heater element, determining a central axis of the resistant heater element using the peripheral shape as a reference and allowing the central axis of the resistant heater element and a central axis of the substrate to be the same axis. A peripheral portion of the resistant heater element can be discriminated by use of X-ray photography or the like in a case where the resistant heater element is embedded within the substrate. Alternatively, the peripheral portion thereof can be discriminated by use of an image processing technology or the like in a case where the resistant heater element is on a surface portion of the substrate.

Moreover, heat uniformity of the heater is conventionally evaluated once the heater is a finished body capable of electrical connection.

In recent years, regarding a heater which heats a semiconductor wafer or the like, since the thermal uniformity thereof directly affects a yield of an element, the requirements for thermal uniformity on the heating surface of the heater have become increasingly strict. It is required to set the thermal uniformity to t° C.±1.0% or less for a predetermined temperature (t° C.) and to minimize the fluctuation range of temperature for a predetermined temperature distribution.

However, conventionally, since thermal uniformity has been evaluated for the finished body after the heater has been brought to completion, the heat uniformity has never been confirmed in the middle of the manufacturing process thereof. Moreover, the size of the finished body is already determined based on the relationship between the heater and the semiconductor manufacturing apparatus incorporating the heater built therein. Thus, it was not easily possible to change the shape of the heater in order to improve thermal uniformity and the like.

SUMMARY OF THE INVENTION

An object of the present invention is to provide a heater including a heating surface, which is capable of obtaining the required thermal uniformity, and a method of manufacturing the same.

The required thermal uniformity as described above means an even temperature distribution across a heating surface of a substrate. To obtain the required uniformity means to obtain a temperature distribution with a small temperature difference, to correct and change the temperature distribution into an appropriate one corresponding to the environment for use in which a predetermined film is formed on a wafer, or to minimize variations of the temperature distribution between individual products.

In order to accomplish the object of the present invention, according to one aspect of the present invention, a heater is provided including a plate-shaped substrate including a heating surface for heating an object to be heated and a resistant heater element provided in the substrate or on a surface thereof. A central axis C1 of a circumscribed circle of the resistant heater element and a central axis C2 of the substrate are not concentric and there is a gap between the two axes.

According to another aspect of the present invention, a method of manufacturing a heater is provided, including forming a plate-shaped preliminary substrate having a resistant heater element in the substrate or on a surface thereof and having a heating surface for heating an object to be heated on one side of the substrate; specifying a position of the central axis C1 of the resistant heater element provided in the preliminary substrate; evaluating thermal uniformity of the heating surface of the preliminary substrate; specifying a position for the central axis C2 of the substrate to be located in a position where the thermal uniformity of the heating surface is superior compared to the case where the central axis C2 of the substrate is positioned at the central axis C1, based on the thermal evaluation result; and forming a substrate which having the central axis C2 by performing grinding processing of the preliminary substrate.

According to the heater of the present invention and the manufacturing method thereof, by shifting the position of the central axis C2 of the substrate from that of the central axis C1 of the circumscribed circle of the resistant heater element, the thermal uniformity on the heating surface of the heater can be improved.

BRIEF DESCRIPTION OF THE DRAWINGS

FIGS. 2A to 2D show states of a substrate constituting the heater of the embodiment and a resistant heater element disposed in the substrate.

DETAILED DESCRIPTION OF THE INVENTION

The inventor of this application has studied the properties of various heaters, each of which has a central axis of a substrate and a central axis of a resistant heater element on the same axis. Through this study, the inventor has found out that the temperature distribution of a heating surface does not always show a symmetric distribution around a center of the substrate when the center of the substrate is set as a reference and that a series of heating conditions, including calcining, firing and the like, which are applied to the substrate in a manufacturing process, greatly affect the temperature distribution of the heating surface of the heater.

Based on the above knowledge, the inventor has found out that the heat uniformity on the heating surface of the substrate can be improved and, alternatively, the temperature distribution can be changed into a desired distribution by providing a gap between the central axis of the resistant heater element and the central axis of the substrate. Furthermore, the inventor has also found out that the thermal uniformity of the heating surface of the substrate can be improved by evaluating the thermal uniformity after heat treatment, including calcining or firing, which affects the temperature distribution of the heating surface of the substrate, and by adding a step of processing the substrate shape so provide a gap between the central axis of the substrate and the central axis of the resistant heater element based on the evaluation result. Thus, the inventor has completed the present invention.

It should be noted that, in the present invention, the central axis of the resistant heater element means an axis which passes through a center of a circumscribed circle of a peripheral shape of the resistant heater element and is perpendicular to the heating surface of the substrate. Moreover, when the resistant heater element includes a plurality of heater element units, the central axis of the resistant heater element means an axis which passes through a center of a circumscribed circle of a peripheral shape of a projected image of all the heater element units on the heating surface of the substrate and is perpendicular to the heating surface. When the central axis of the resistant heater element is merely called a center of the resistant heater element, the center means a position of the central axis of the resistant heater element on the heating surface of the substrate.

Moreover, in the present invention, the central axis of the substrate means an axis which passes through a center of a circumscribed circle having a peripheral shape of the heating surface of the substrate and is perpendicular to the heating surface. When the central axis of the substrate is merely called a center of the substrate, the center means the center of the circumscribed circle having the peripheral shape of the heating surface of the substrate.

With reference to the drawings, embodiments of the present invention will be described below.

Figure 1A:
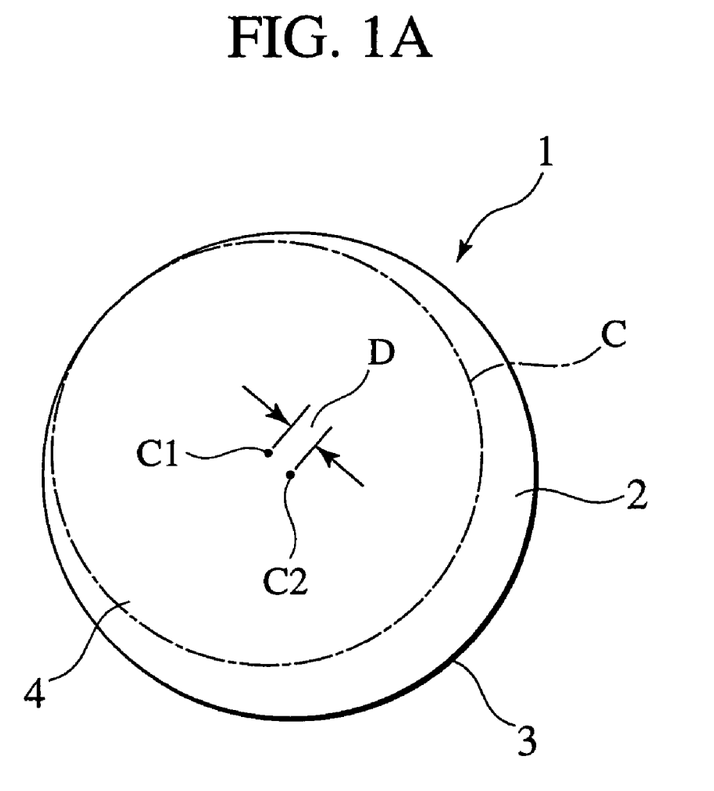
FIG. 1A is a plan view of a heater according to one embodiment of the present invention and FIG. 1B is a side view of the heater shown in FIG. 1A.
Figure 1B:
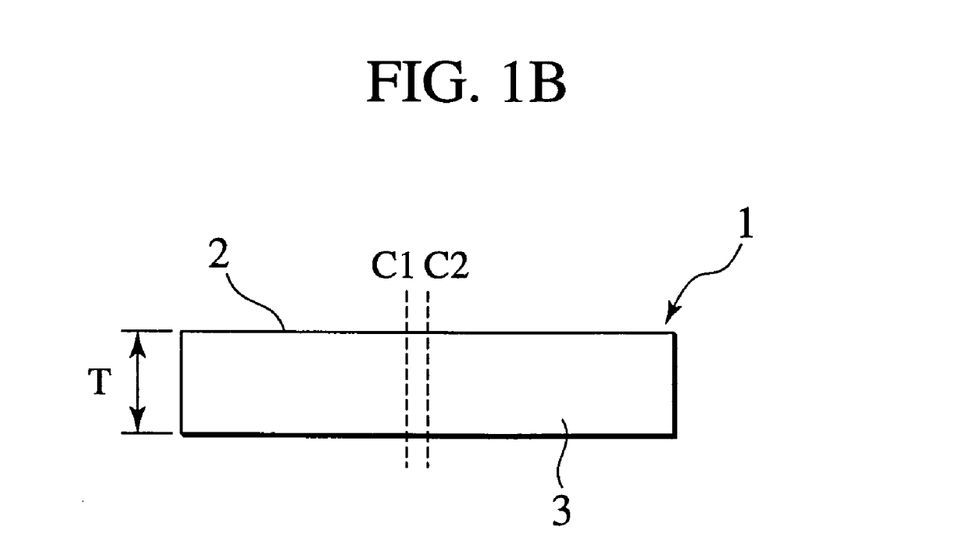

FIGS. 1A and 1B show a heater 1 as an embodiment of the present invention. This heater 1 includes at least a disc-shaped substrate 3 having a heating surface 2 for heating an object to be heated; and a resistant heater element 4 provided on this substrate 3. As shown in FIG. 1A, a central axis of a circumscribed circle C of the resistant heater element 4, that is, a central axis C1 of the resistant heater element 4 and a central axis C2 of the substrate 3 are not located at the same position and there is a gap D between the central axes C1 and C2. Namely the central axis C1 and the central axis C2 are not concentric.

The heater 1 heats the substrate and is preferably used for heating a semiconductor wafer, a crystalline substrate or the like as an object to be heated. The object is placed on the heating surface 2 of the heater 1.

The substrate 3 is formed by use of aluminum nitride, silicon carbide, silicon nitride, aluminum oxide, aluminum, and alloys thereof or stainless-steel. A thickness T of the substrate 3 is, for example, 0.5 mm to 30 mm. A peripheral shape of the substrate 3 may be not only a circle, as shown in FIG. 1A, but also a substantially regular polygon. When the peripheral shape of the substrate 3 is a circle, an axis which passes through a center of the circle and is perpendicular to the heating surface 2 becomes a central axis C2 of the substrate. On the other hand, when the peripheral shape of the substrate 3 is a substantially regular polygon, an axis which passes through a center of a circumscribed circle of the substantially regular polygon and is perpendicular to the heating surface becomes the central axis C2 of the substrate.

Note that both sides of the substrate of the heater shown in FIGS. 1A and 1B have the same size and the same shape. Thus, the peripheral shape of the substrate 3 coincides with a peripheral shape of the heating surface 2. However, when the heating surface 2 and the side opposite thereto have different sizes and shapes from each other, the central axis C2 of the substrate is determined by use of the peripheral shape of the heating surface 2 as a reference.

Moreover, the heating surface 2 of the substrate 3 may be flat as shown in FIG. 1B and may also have a recess having trenches in a region where the object to be heated is placed. Alternatively, the surface on which the object is placed can be embossed or can be formed as an uneven surface by providing grooves therein.

Further, the resistant heater element 4 is made of molybdenum, tungsten, a compound of tungsten and molybdenum, platinum or the like. The resistant heater element may have a linear shape, a mesh shape or a film shape. As a linear shaped resistant heater element, one obtained by folding coiled or ribbon-shaped metal or the like can be used. Bulk metal or printed metal paste may be used therefor. The resistant heater element may be embedded within the substrate 3 or may be formed by printing a metal paste on an exposed surface of the substrate 3.

Figure 2A:
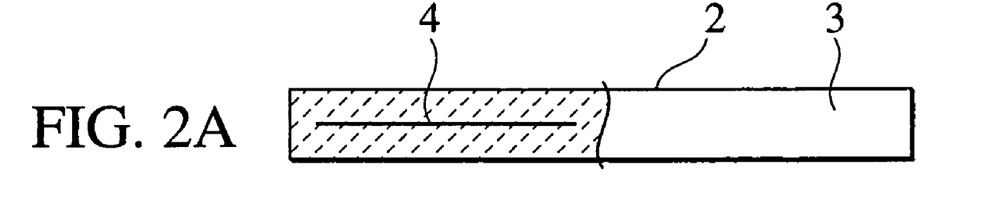
FIGS. 2A and 2B are partial cut away views.
Figure 2B:
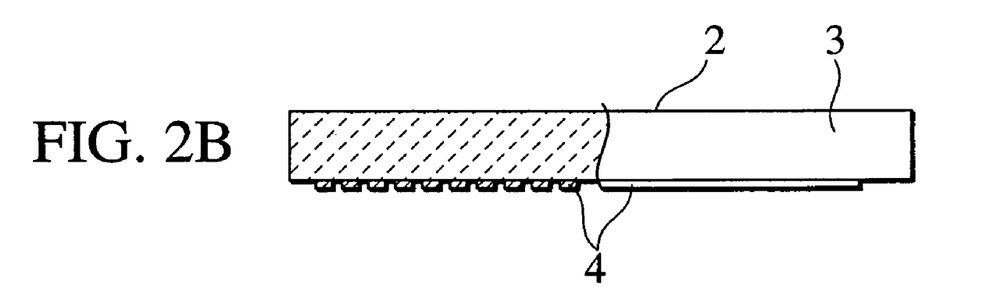
Figure 2C:
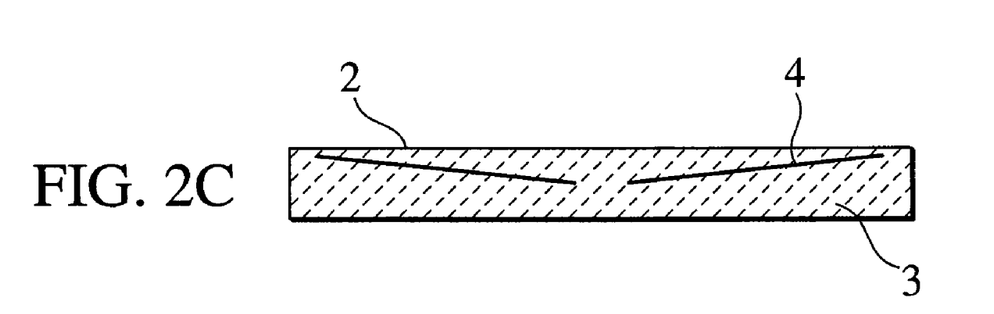
FIGS. 2C and 2D are cross-sectional views of the substrate.
Figure 2D:
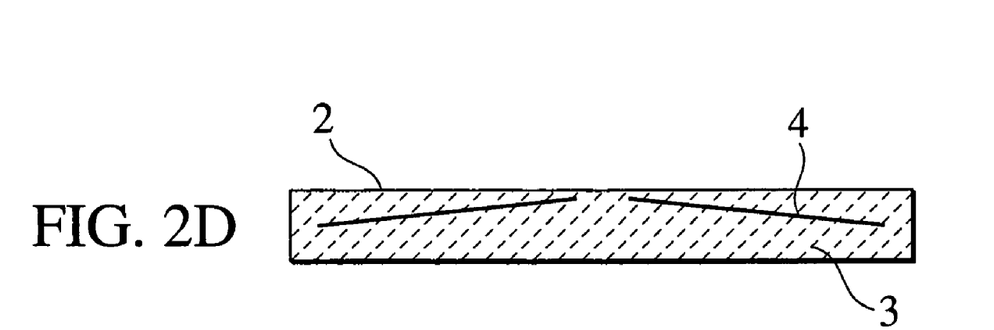

The resistant heater element 4 is embedded within the substrate 3 as shown, for example, in FIGS. 2A, 2C and 2D. The resistant heater element 4 may be disposed approximately in parallel with the heating surface 2 as shown in FIG. 2A or may be disposed so as to have its outer portion shallow and its central portion deep within the substrate 3 as shown in FIG. 2C. Alternatively, as shown in FIG. 2D, the resistant heater element 4 may be disposed so as to have its outer portion deep and its central portion shallow within the substrate 3. Moreover, as shown in FIG. 2B, the resistant heater element may be formed by paste printing on the side opposite to the heating surface 2.

Furthermore, a peripheral shape of the resistant heater element 4 may be either circular or polygonal. When the peripheral shape of the resistant heater element 4 is polygonal, an axis which passes through a center of a circumscribed circle tangent to the peripheral shape of the resistant heater element and is perpendicular to the heating surface of the substrate 3 is set as a central axis of the resistant heater element 4.

Figure 5A:
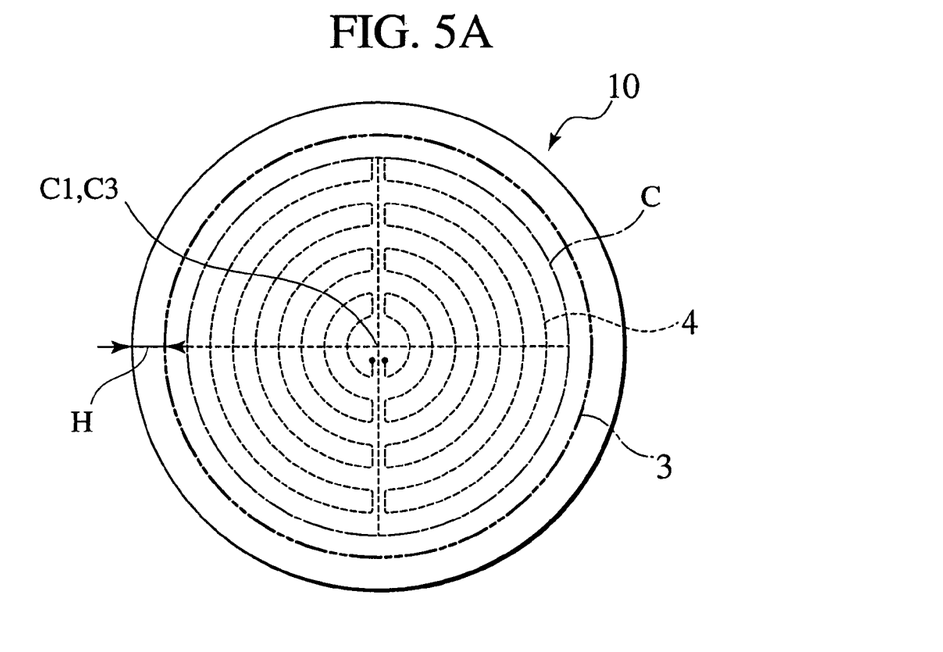
FIG. 5A is a plan view of a preliminary substrate formed in a preliminary substrate formation step S1 and having a circular resistant heater element disposed thereon.
Figure 5B:
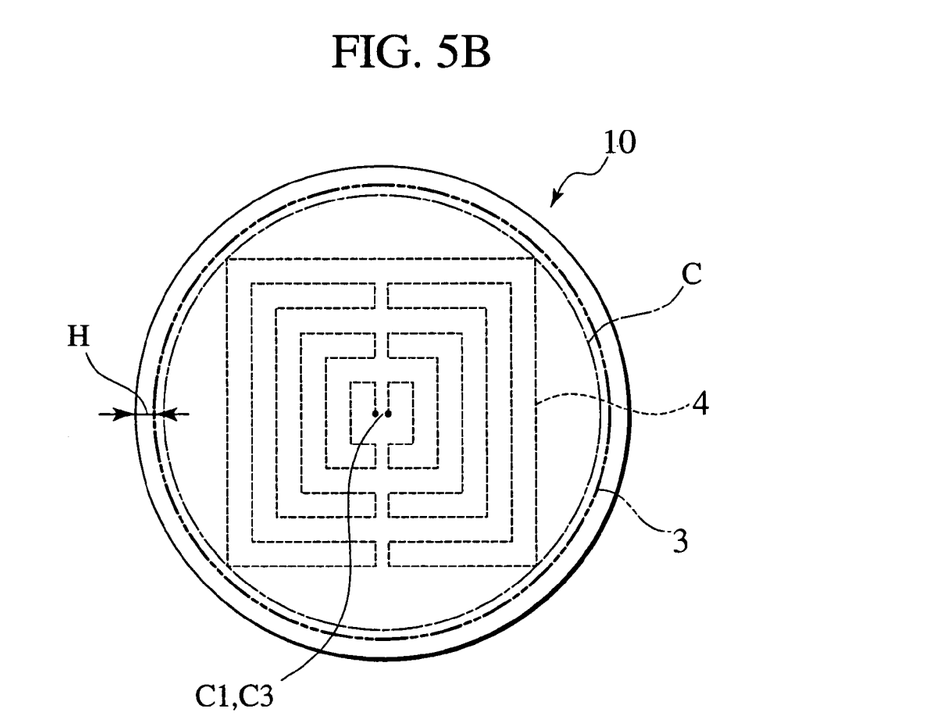
FIG. 5B is a plan view of a preliminary substrate having a polygonal resistant heater element disposed thereon.

FIGS. 5A and 5B show a preliminary substrate 10 formed in a preliminary substrate formation step in a method of manufacturing the heater of the present invention, which will be described later. A circular resistant heater element 4 is disposed in the preliminary substrate 10 shown in FIG. 5A and a square (regular polygonal) resistant heater element 4 is disposed in the preliminary substrate 10 shown in FIG. 5B. The two resistant heater elements pass through a center of a circumscribed circle C (indicated by a dashed line) tangent to the resistant heater element 4 and take an axis perpendicular to the heating surface as the central axis C1 of the resistant heater element 4.

By sending electricity to the resistant heater element 4, the heating surface 2 of the heater 1 is heated. In the heater according to this embodiment, there is a gap between the position of the central axis C1 of the resistant heater element 4 and the position of the central axis C2 of the substrate 3 and thermal uniformity of the heating surface 2 of the substrate 3 can be improved by means of this gap. The position of the central axis C2 of the substrate 3 relative to that of the central axis C1 of the resistant heater element 4, that is, the size and direction of the gap D are preferably set in such a manner that the heat uniformity on the heating surface of the substrate is superior compared to a case where the central axes C1 and C2 are positioned on the same axis.

The gap D is preferably set within a range of 0.005 to 10 mm. When a lower limit of the gap D is set to 0.005 mm, required thermal uniformity attributable to the gap can be achieved. At the same time, when an upper limit thereof is set to 10 mm, required thermal uniformity can be achieved by positioning the resistant heater element 4 while avoiding interference with other parts (not shown) provided on the substrate 3 such as a lift pin hole and a shaft.

The lift pin hole and the shaft are provided by using the substrate central axis C2 as a reference. Thus, when the gap D exceeds 10 mm, the resistant heater element 4 interferes with the lift pin hole and the shaft and thus the thermal uniformity is lowered. Besides, particularly in the case of a heater with a shaft attached thereto, it becomes difficult to take out rods (not shown) which are provided in the shaft in order to connect terminals connected to both ends of the resistant heater element 4 with external connectors. Consequently, the gap D is set more preferably to 0.01 mm to 8 mm and further preferably to 0.02 mm to 5 mm.

Figure 3A:
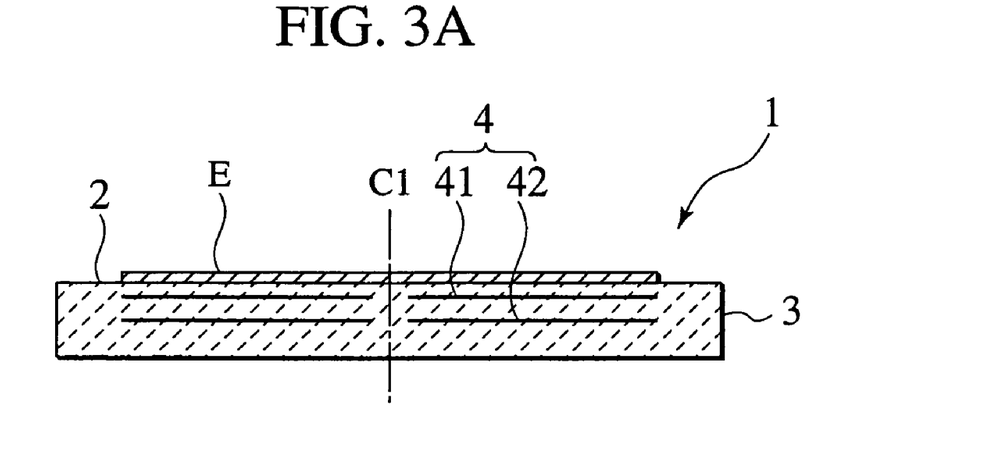
FIGS. 3A to 3C are cross-sectional views showing other disposition states of a resistant heater element embedded within the substrate of the heater of the embodiment.
Figure 3B:
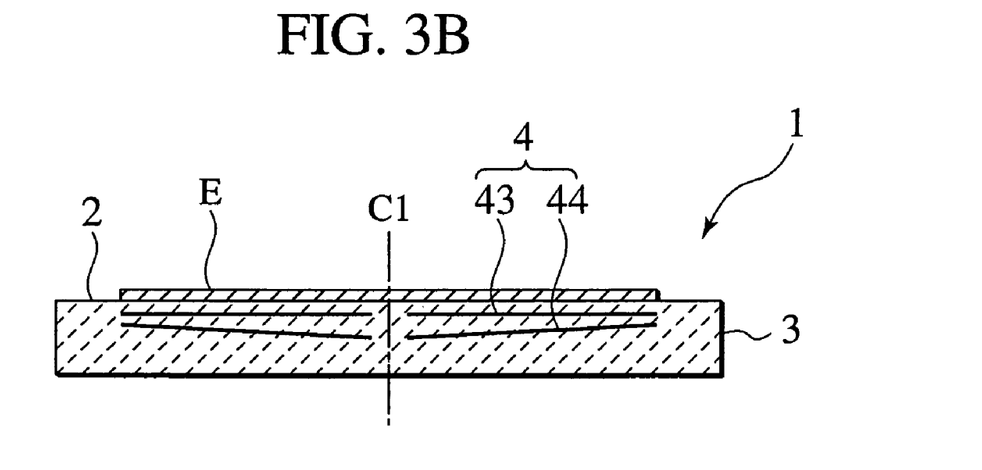
Figure 3C:
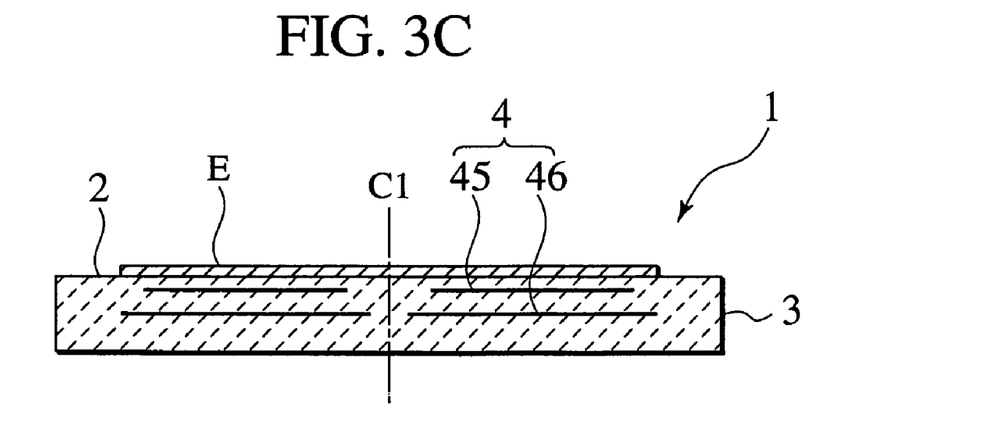

Moreover, as shown in FIGS. 3A to 3C, in the heater 1, the resistant heater element 4 can include one or a plurality of heater element units 41, 42, . . . which are provided in the substrate 3. In this case, an axis which passes through a center of a circumscribed circle relative to a projected shape E to the heating surface 2 of the heater element units 41, 42, . . . and is perpendicular to the heating surface is set as the central axis C1 of the resistant heater element 4.

The resistant heater element 4 shown in FIG. 3A includes two heater element units 41 and 42 which are disposed approximately in parallel with the heating surface 2 and have the same size. The resistant heater element 4 shown in FIG. 3B includes one heater element unit 43 disposed approximately in parallel with the heating surface 2 and a cone-shaped heater element unit 44 deep in its center. The resistant heater element 4 shown in FIG. 3C includes two heater element units 45 and 46 which are disposed approximately in parallel with the heating surface 2 and have different sizes from each other (the lower one is formed to be wider than the upper one).

It should be noted that when the resistant heater element 4 includes a plurality of heater element units 41, 42, . . . , the respective heater element units can be disposed not only by changing the depth from the heating surface 2 as shown in FIGS. 3A to 3C but also by arranging the plurality of heater element units at the same depth from the heating surface 2.

Next, the method of manufacturing the heater according to the embodiment will be described.

Figure 4:
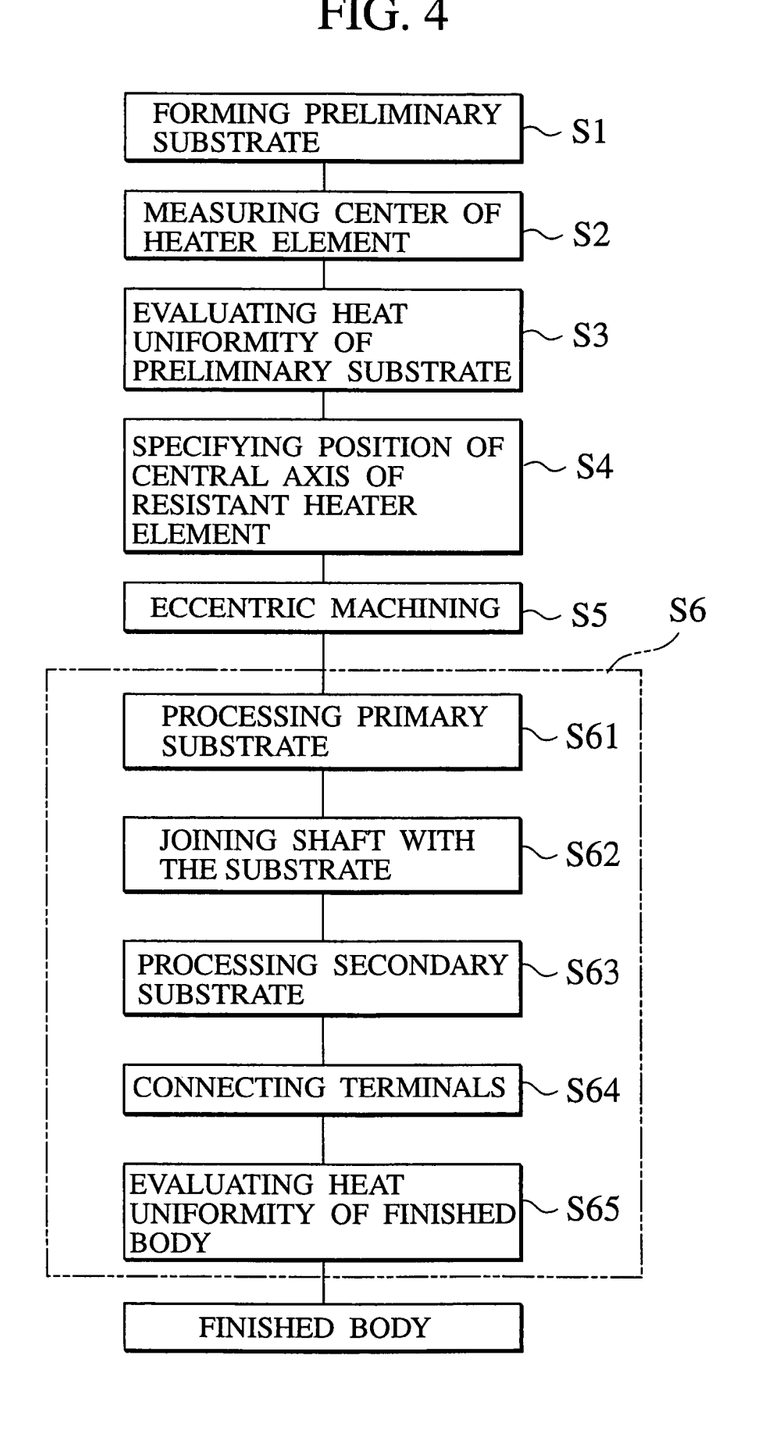
FIG. 4 is a flowchart showing a method of manufacturing the heater of the embodiment.

FIG. 4 is a flowchart of the manufacturing method. The method of manufacturing the heater 1 according to the embodiment includes the steps of S1: forming a plate-shaped preliminary substrate 10 having two sides with a larger area than the substrate 3; S2: a heater element center measurement step performed by specifying the position of the central axis of the resistant heater element 4 provided in the preliminary substrate 10; S3: evaluating the heat uniformity of the preliminary substrate 10; s4: determining the substrate center position by specifying the position of the central axis C2 of the substrate 3, based on the heat uniformity evaluation result, in the direction in which the required thermal uniformity can be obtained using the center C1 of the resistant heater element 4 as a reference; and S5: an eccentric machining step to obtain the substrate 3 having the central axis C2 by subjecting the preliminary substrate 10 to a grinding processing step. Furthermore, thereafter, in order to obtain a finished body, a final processing series step S6 is performed.

In the preliminary substrate formation step S1, a preliminary substrate 10 having two sides with a larger area than the finished substrate body 3 is formed. Specifically, in the preliminary substrate formation step S1, ceramic powder such as aluminum nitride, silicon carbide, silicon nitride and aluminum oxide, for example, is filled into a mold and subjected to preliminary molding until the powder has a certain degree of hardness so as to obtain a preformed body. In this process, a recess corresponding to the shape of the resistant heater element is provided on a surface of the preformed body. A resistant heater element 4, made of a linear or mesh shaped metal bulk body, is housed in the recess and is covered with the same ceramic powder. With this process, an element for a high frequency electrode and an element for an electrostatic chuck can be simultaneously embedded.

This embedding of the resistant heater element 4 is performed only once in the case of the heater 1 shown in FIGS. 2A to 2D. However, the embedding thereof is performed for every heater element unit in the case of the heater 1 shown in FIGS. 3A to 3D.

Thereafter, aluminum nitride powder is subjected to uniaxial pressure molding to provide a disc-shaped molded body, and then the molded body is sintered by hot-pressing. Thus, the preliminary substrates 10 shown in FIGS. 5A and 5B are formed. FIG. 5A shows a preliminary substrate 10 in which a circular resistant heater element 4 is embedded and FIG. 5B shows a preliminary substrate 10 in which a square (regular polygonal) resistant heater element 4 is embedded.

In the preliminary substrate formation step S1, heat treatment is performed for the substrate material under the various processing conditions for sintering the molded body or sintering by hot-pressing as needed. When an aluminum nitride powder is used as the substrate material, for example, sintering is performed by holding the substrate material at a temperature of 1700 to 1900° C. for about 2 to 6 hours.

It should be noted that the method of manufacturing the preliminary substrate 10 is not particularly limited to the above. Various molding methods and other sintering methods such as a normal pressure sintering method can be also used.

Moreover, when a printed electrode is formed as the resistant heater element, a plate-shaped molded body is formed using a ceramic green sheet and, thereafter, a pattern having a linear shape, a mesh shape or a film shape is printed on one side of the molded body using a metal paste such as tungsten or molybdenum. Thereafter, another ceramic green sheet is laminated thereon and sintering is performed.

When metal such as aluminum or stainless steel is used as the substrate material, for example, a metal plate having a groove to mount the resistant heater element is prepared and, after mounting the resistant heater element in the groove, another metal plate is laminated thereon. Subsequently, the two metal plates are integrated with each other by screwing, soldering or the like. It should be noted that in this case, the periphery of the resistant heater element is covered with a heat-resistant insulating material so as to electrically isolate the resistant heater element from the metal plates.

This preliminary substrate 10 is formed to have two sides with a larger area than the substrate 3 of the finished body, because of the processing area H. In FIGS. 5A and 5B, an outline of the substrate 3 is indicated by a double dashed line. When the processing area H is large, the burden on later grinding processing is large. Thus, in consideration of the above point, the width of processing area H is set to 5 mm or less, and more preferably to about 1.5 mm.

In the heater element center measurement step S2, by using X-ray photography, image processing technologies or the like, the central axis C1 of the resistant heater element provided on the preliminary substrate 10 is specified. It should be noted that, in practice, it is sufficient to specify only a passing point of the central axis C1 of the resistant heater element in the heating surface 2 of the preliminary substrate 10. It should also be noted that the central axis C3 of the preliminary substrate 10 and the central axis C1 of the resistant heater element 4 are set on approximately the same axis.

In the heat uniformity evaluation step S3, the temperature distribution on the surface of the preliminary substrate 10, to be the heating surface 2 of the final substrate 3, is measured using an infrared thermometer, for example. This temperature distribution measurement is performed after processing the preliminary substrate 10 to have a shape required for the measurement.

In the substrate center position determination step S4, based on the heat uniformity evaluation result, the position of the central axis C2 is set to be located in a position where heat uniformity is superior compared to a case where the central axis C2 of the substrate and the central axis C1 of the resistant heater element are located on the same axis in the finished substrate. Preferably, the direction of a positional deviation of the central axis C2 of the substrate 3 and the gap D thereof are set using the central axis C1 of the resistant heater element 4 as a reference so as to minimize the area of a hot portion in the heating surface to be grinded and to maximize the area of a cool portion therein to be grinded. It should be noted that, in practice, it is sufficient to specify only a passing point of the central axis C1 of the substrate 3 in the heating surface 2 of the preliminary substrate 10, that is, the center C1 of the substrate 3.

In the eccentric machining step S5, the direction of positional deviation (the direction of arrow K1 of FIG. 7 or arrow K2 of FIG. 9) and the gap D, which are set in the previous step S4, are entered into a NC processing machine, for example, and its offset function processes the preliminary substrate 10 by using the specified position of the central axis C2 as a processing center. For example, in Examples 1 and 2 described below, by this processing of the substrate, the grinded area J1 (see FIG. 7) or the grinded area J2 (see FIG. 9), which are indicated by hatching between an outer rim of the substrate 3 and an outer rim of the preliminary substrate 10, are removed. Thus, the substrate 3 having the processing center as the central axis C2 can be manufactured. In the substrate 3, the resistant heater element 4 having the central axis C1 whose position is shifted from the substrate central axis C2 is provided.

As shown in FIG. 4, the final processing step S6 includes: a primary substrate processing step S61 of providing a lift pin hole in the substrate 3 and processing the substrate 3 into the required shape for the shaft junction step; a shaft junction step S62 of joining a shaft with the substrate 3; a secondary substrate processing step S63 of finishing the entire body into a final shape; a terminal junction step S64 of joining terminals with both ends of the resistant heater element 4 and connecting power supply components to the terminals; and a finished body heat uniformity evaluation step S65 of checking the quality of a finished body. A substrate which has passed in the finished body heat uniformity evaluation step S65 becomes a finished body. In manufacturing a heater 1 without a shaft, the shaft junction step S62 and the secondary substrate processing step S63 can be omitted from the final processing step S6.

In the primary substrate processing step S61, the lift pin hole is drilled, and other processings are performed, using the center C2 of the substrate 3 as a reference. It should be noted that the lift pin is a pin which pushes a substrate up in detaching a substrate mounted on the heating surface.

In the shaft junction step S62, when the substrate is made of a ceramic material, the shaft is formed using the same ceramic material and is joined with the substrate 3 by integral junction or by seal junction using an O-ring, metal packing or the like. In the case of subjecting the shaft and the substrate 3 to solid-phase bonding, those two are joined together by performing heat treatment under a high temperature condition close to a sintering temperature. Note that the thermal uniformity of the heating surface of the substrate 3 is most affected by a heat treatment condition in performing sintering of ceramics that is the substrate material in the preliminary substrate formation step S1 and is less affected by heat treatment performed for joining the substrate with the shaft. Therefore, the heat uniformity evaluation of the heating surface of the substrate 3, which is performed before specifying the position of the central axis C2 of the substrate 3, is preferably performed after the step of sintering the preliminary substrate 10.

In the secondary substrate processing step S63, the entire shape including the shaft undergoes finishing processing. For the power supply component used in the terminal junction step S64, metal is preferable, particularly nickel (Ni). The power supply component is applied in a shape of a rod or a wire. As means for electrically connecting the power supply component to the terminal, screwing, caulking, engaging, soldering, welding, eutectic bonding and the like are applicable.

According to the manufacturing method of the embodiment, as to the temperature distribution produced by the heat treatment conditions and the like in the process of manufacturing the preliminary substrate 10, by subjecting the preliminary substrate to the eccentric machining and by shifting the central axis C2 of the substrate 3 which is ultimately obtained from the central axis C1 of the resistant heater element, the temperature distribution in the heating surface of the substrate 3 can be adjusted to have a required temperature distribution and the thermal uniformity can be improved.

EXAMPLES

Comparative Example 1

Comparative Example 1 is a conventional heater 100 in which the central axis C2 of the substrate 3 and the central axis C1 of the resistant heater element are on the same axis, that is, are concentric. The substrate 3 of the heater 100 is made of aluminum nitride and is a disc of $\phi 335$ mm×15 mm of thickness T. The resistant heater element 4 is formed of a molybdenum coil and is embedded within the substrate 3 as shown in FIG. 2A.

Figure 6A:
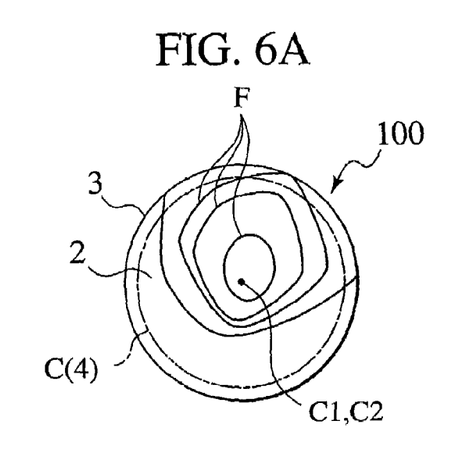
FIG. 6A is an isothermal map on a heating surface of the heater of Comparative Example 1 and FIG. 6B is a graph showing the temperature distribution on a circumference of a circle with a radius of 138 mm of the heater of Comparative Example 1.
Figure 6B:
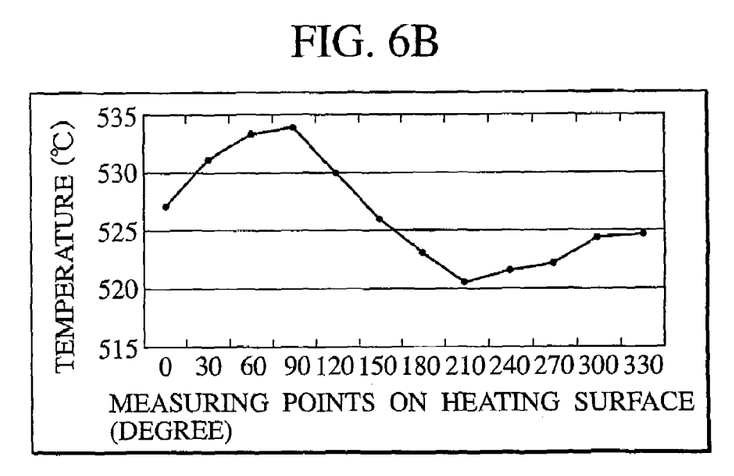

FIGS. 6A and 6B show temperature distributions in the heating surface 2 of the heater 100. In the temperature distribution shown in FIG. 6A, results obtained by measuring temperatures on the heating surface 2 by use of an infrared thermometer are indicated by isothermal curves F on the heating surface 2. The temperature distribution shown in FIG. 6B, indicates a distribution of temperatures at twelve measuring points on the heating surface 2 which are set at even intervals on the circumference of a circle with radius 138 mm which takes the substrate center C2 as a reference. Note that a set temperature is 525° C.

Example 1

Figure 6C:
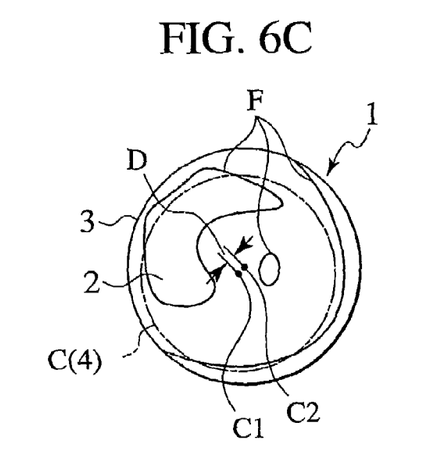
FIG. 6C is an isothermal map on a heating surface of the heater of Example 1 and FIG. 6D is a graph showing the temperature distribution on a circumference of a circle with a radius of 138 mm of the heater of Example 1.

Example 1 is a heater 1 in which the central axis C2 of the substrate 3 and the central axis C1 of the resistant heater element are set by leaving a gap therebetween. In this heater 1, as shown in FIG. 6C, the central axis C1 of the resistant heater element 4 is set below the central axis C2 of the substrate 3 at an angle to the left of C2 on the drawing. The gap D between the central axes C1 and C2 is 1.5 mm.

The substrate 3 of the heater 1 is made of aluminum nitride and is a disc of $\phi 335$ mm×15 mm of thickness T. The materials, shapes and sizes of the substrate 3 and the resistant heater element are the same as those of Comparative Example 1.

Figure 6D:
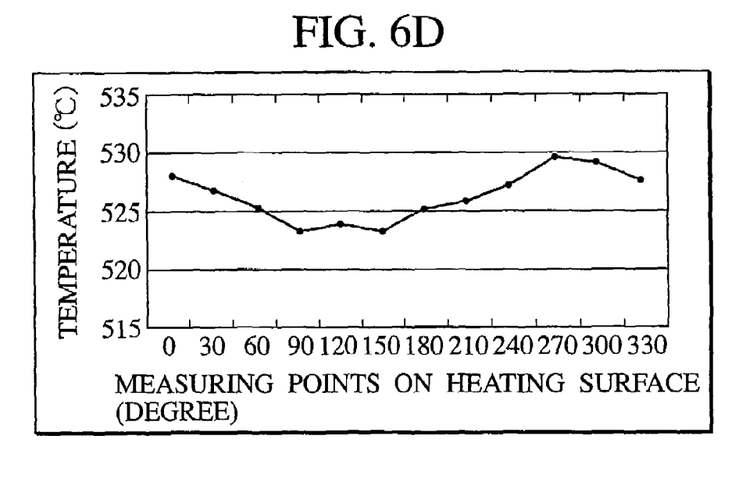

FIGS. 6C and 6D show temperature distributions in the heating surface 2. The measurement conditions of the temperature distributions and the method of displaying the temperature distributions are the same as those of Comparative Example 1.

Figure 7:
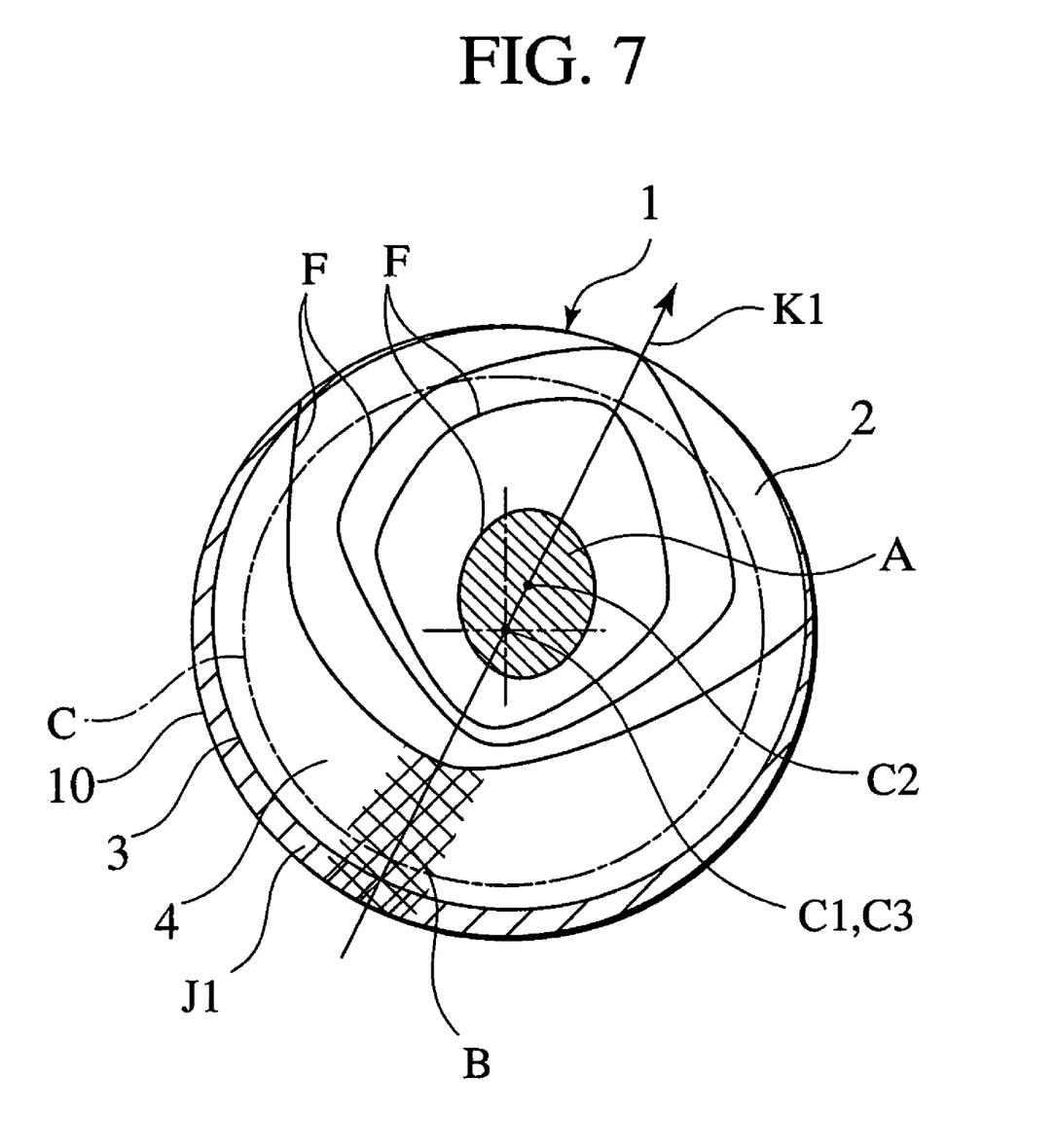
FIG. 7 shows a way to shift the position of the substrate central axis C2 with respect to the preliminary substrate central axis C3 and a resistant heater element central axis C1 in a substrate center position determination step S4 in Example 1.

The heater of Example 1 is manufactured by use of the manufacturing method shown in FIG. 4. FIG. 7 shows the preliminary substrate 10, the position of the central axis C1 of the resistant heater element, which is specified in the heater element center measurement step S2, the temperature distribution (isothermal curves) on the heating surface, which is obtained in the heat uniformity evaluation step S3, and the position of the central axis C2 of the substrate 3, which is specified in the substrate center position determination step. Furthermore, in FIG. 7, a grinded area in the eccentric machining step S5 is denoted by J1.

As shown in FIG. 7, in the heater of Example 1, as a result of the heat uniformity evaluation, a hot portion A emerges in an area (indicated by hatching) which spreads upward at an angle to the right from a central portion of the preliminary substrate 10 and a cool portion B emerges in a lower left area (indicated by cross-hatching) of the preliminary substrate 10. Thus, the position of the central axis C2 of the substrate 3 as the finished body is set at a position shifted by 1.5 mm in a direction of the arrow K1 passing the center C1 of the heater element 4 and facing the hot portion A from the cool portion B. The substrate 3 having the central axis C2 is obtained after the eccentric machining step S5.

$\Delta T$ (=[maximum temperature]−[minimum temperature]) at the twelve measuring points on the heating surface 2 which are set at even intervals on the circumference of the circle with radius 138 mm which takes the center C2 of the substrate 3 as a reference is 5.8° C. in the heater 1 of example 1 but is 13.2° C. in the heater 100 of Comparative Example 1. Compared to the heater 100, in the heater 1, the heat uniformity at 525° C. is improved by 4.9° C. per gap of 1.0 mm.

Moreover, it is understood that, compared to the heater 100 of comparative example 1, the heater 1 of Example 1 has fewer isothermal curves F and has achieved evenness of heat across the entire heating surface 2. Specifically, regarding a heat uniformity requirement of t° C.±1.0% or less (525±5° C.), the heater 100 has ±1.3% but the heater 1 is improved to have ±0.5%

Comparative Example 2

A heater 100 of Comparative Example 2 is a conventional heater 100 in which the central axis C2 of the substrate 3 and the central axis C1 of the resistant heater element are on the same axis, that is, are concentric. The substrate 3 of the heater 100 is made of aluminum nitride and is a disc of $\phi 340$ mm×17 mm of thickness T. Moreover, as shown in FIG. 3A, the resistant heater element 4 includes: a first heater element unit 5 disposed in a region which is 6.5 mm deep from the heating surface 2; and a second heater element unit 5 disposed in a region which is 12 mm deep from the heating surface 2. Therefore, the circumscribed circle C of the resistant heater element 4 is a circumscribed circle abutting on the periphery of the projected shape of the first and second heater element units 41 and 42.

Figure 8A:
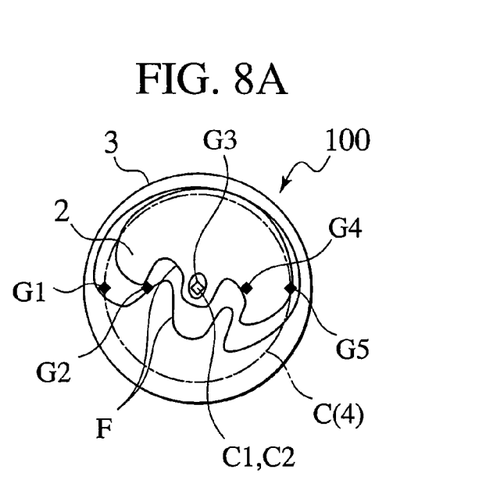
FIG. 8A is an isothermal map on a heating surface of the heater of Comparative Example 2 and FIG. 8B is a graph showing the temperature distribution on a line passing through the substrate center C1 of the heater of Comparative Example 2.
Figure 8B:
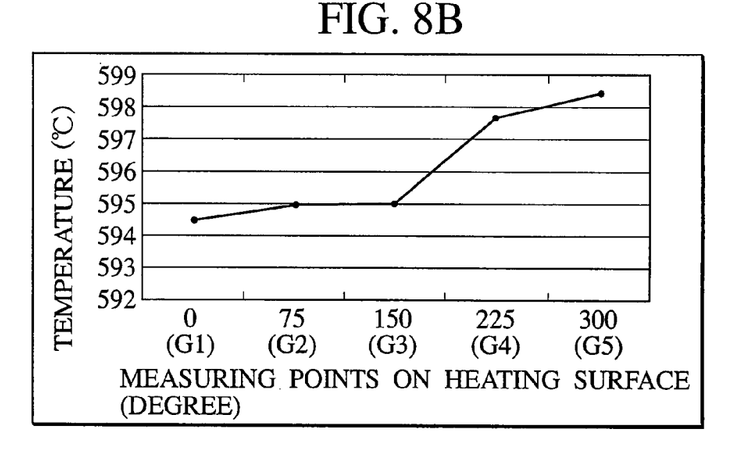

FIGS. 8A and 8B show temperature distributions in the heating surface 2 of the heater 100 of Comparative Example 2. In the temperature distribution shown in FIG. 8A, results obtained by measuring temperatures on the heating surface 2 by use of an infrared thermometer are indicated by isothermal curves F on the heating surface 2. The temperature distribution shown in FIG. 8B, indicates a distribution of temperatures at five measuring points G1 to G5 on the heating surface 2 which are set at even intervals on a diameter passing through the substrate center C2. Note that a set temperature is 600° C.

Example 2

Figure 8C:
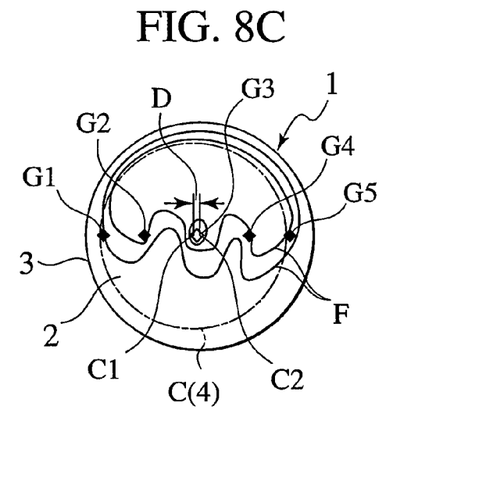
FIG. 8C is an isothermal map on a heating surface of the heater of Example 2 and FIG. 8D is a graph showing the temperature distribution on a line passing through the substrate center C1 of the heater of Example 2.
Figure 8D:
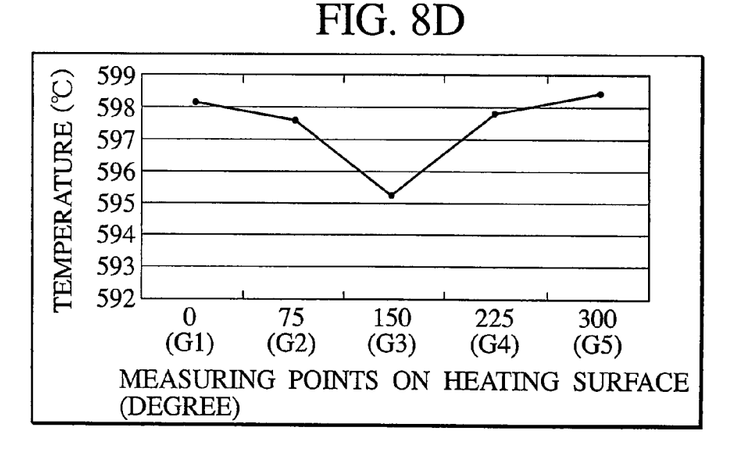

Example 2 is a heater 1 in which the central axis C2 of the substrate 3 and the central axis C1 of the resistant heater element are set by leaving a gap therebetween. As shown in FIG. 8C, in this heater 1, the position of the central axis C1 of the resistant heater element 4 is set to the left of the position of the central axis C2 of the substrate in a horizontal direction on the drawing. The gap D between the central axes C1 and C2 is 1.0 mm.

The substrate 3 of the heater 1 of example 2 is made of aluminum nitride and is a disc of φ335 mm×15 mm of thickness T. The materials, shapes and sizes of the substrate 3 and the resistant heater element are the same as those of Comparative Example 2.

Figure 9:
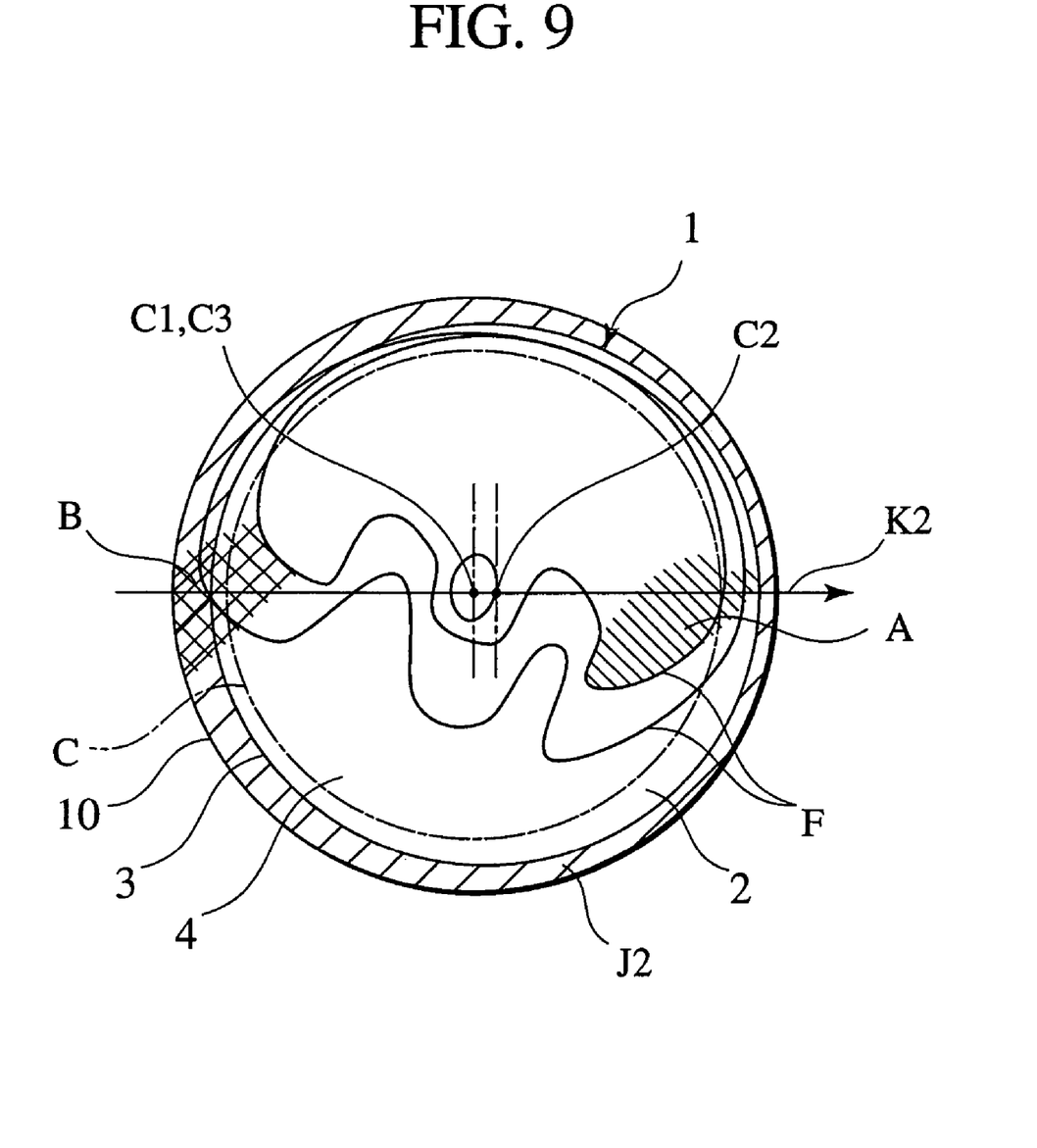
FIG. 9 shows a way to shift the position of the substrate central axis C2 with respect to the preliminary substrate central axis C3 and a resistant heater element central axis C1 in a substrate center position determination step S4 in Example 2.

The heater of Example 2 is manufactured by use of the manufacturing method shown in FIG. 4. FIG. 9 shows the position of the central axis C1 of the resistant heater element, which is specified in the heater element center measurement step S2, the temperature distribution (isothermal curves) on the heating surface, which is obtained in the heat uniformity evaluation step S3, and the position of the central axis C2 of the substrate 3, which is specified in the substrate center position determination step, in the preliminary substrate 10. Furthermore, in FIG. 9, a region to be deleted in the eccentric machining step S5 is denoted by J2.

As shown in FIG. 9, in the heater of Example 2, as a result of the heat uniformity evaluation, a hot portion A emerges in an area (indicated by hatching) at a right end along a horizontal diameter of the preliminary substrate 10 and a cool portion B emerges in an area (indicated by cross-hatching) at a left end along the horizontal diameter of the preliminary substrate 10. Thus, the position of the central axis C2 of the substrate 3 as the finished body is set at a position shifted by 1.0 mm in a direction of the arrow K2 passing the center C1 of the heater element 4 and facing the hot portion A from the cool portion B. The substrate 3 having the central axis C2 is obtained after the eccentric machining step S5.

A temperature difference ΔT (=|TG1−TG5|) between the measuring points G1 and G5 on the heating surface 2, which are set at even intervals on the diameter passing through the substrate center C2, is obtained. Consequently, the temperature difference ΔT is 0.3° C. in the heater 1 of Example 2 but is 4.0° C. in the heater 100 of Comparative Example 2. Compared to the heater 100 of Comparative Example 2, in the heater 1 of Example 2, the heat uniformity at 600° C. is improved by 3.7° C. per gap of 1.0 mm.

Moreover, in the heater 1 of Example 2, regarding the shape of the isothermal curves F taking the longitudinal diameter passing through the substrate center C2 as a reference, a degree of symmetry is increased compared to the heater 100 of Comparative Example 2. Thus, a symmetrical heat uniformity is achieved.

As described above, according to the heater of the present invention and the manufacturing method thereof, the central axis of the resistant heater element and the central axis of the substrate are not on the same axis and a predetermined gap is provided between the both central axes. Thus, by use of this gap, the heating surface of the substrate can be set to have a temperature distribution achieving a desired heat uniformity.

Although the inventions have been described above by reference to certain embodiments of the inventions, the inventions are not limited to the embodiments described above. Modifications and variations of the embodiments described above will occur to those skilled in the art, in light of the above teachings.

What is claimed is:
1. A method of manufacturing a heater, comprising:
   forming a plate-shaped preliminary substrate which has a resistant heater element in the substrate or on a surface thereof and includes a heating surface on one side thereof for heating an object to be heated;
   specifying a position of a central axis C1 of the resistant heater element provided in the preliminary substrate;
   evaluating thermal uniformity of the heating surface of the preliminary substrate;
   specifying a position of a central axis C2 of the substrate at a position where the heat uniformity of the heating surface is superior to the case where the central axis C2 of the substrate is on the central axis C1, based on results of the thermal uniformity evaluation; and
   forming the substrate having the central axis C2 by subjecting the preliminary substrate to grinding processing along an outer periphery of the preliminary substrate.

2. The method according to claim 1, wherein the position of the central axis C2 of the substrate is specified so as to set a gap between the central axis C2 and the central axis C1 of the resistant heater element to be within a range of 0.005 mm to 10 mm.

3. The method according to claim 1, wherein the position of the central axis C2 of the substrate is specified so as to set a gap between the central axis C2 and the central axis C1 of the resistant heater element to be within a range of 0.01 mm to 8 mm.

4. The method according to claim 1, wherein the central axis C1 of the resistant heater element is specified based on an X-ray photographed image of the resistant heater element.

5. The method according to claim 1, wherein, in the thermal uniformity evaluation of the heating surface, a temperature distribution on the heating surface of the preliminary substrate is measured by use of an infrared thermometer.

6. The method according to claim 1, wherein the preliminary substrate includes at least one of ceramics selected from the group consisting of aluminum nitride, silicon carbide, silicon nitride and aluminum oxide as a main component, and the resistant heater element is made of at least one of metals selected from the group consisting of molybdenum, tungsten and platinum.

7. The method according to claim 1, wherein the preliminary substrate formation comprises:
   molding a ceramic body having the resistant heater element embedded therein and
   sintering the molded ceramic body.

8. The method according to claim 7, wherein the step of sintering is performed by hot-pressing.

* * * * *